(12) United States Patent
Lin

(10) Patent No.: US 10,504,588 B2
(45) Date of Patent: Dec. 10, 2019

(54) MULTI-LEVEL VERSATILE MEMORY

(71) Applicant: James Lin, New Haven, CT (US)

(72) Inventor: James Lin, New Haven, CT (US)

(73) Assignee: Alacrity Semiconductors, Inc., Branford, CT (US)

( * ) Notice: Subject to any disclaimer, the term of this patent is extended or adjusted under 35 U.S.C. 154(b) by 0 days.

(21) Appl. No.: 15/153,574

(22) Filed: May 12, 2016

(65) Prior Publication Data

US 2016/0336069 A1 Nov. 17, 2016

Related U.S. Application Data

(60) Provisional application No. 62/160,513, filed on May 12, 2015.

(51) Int. Cl.
| | |
|---|---|
| *G11C 11/56* | (2006.01) |
| *G11C 11/22* | (2006.01) |
| *G06F 12/0802* | (2016.01) |
| *G11C 11/00* | (2006.01) |
| *G11C 8/12* | (2006.01) |

(52) U.S. Cl.
CPC ...... *G11C 11/5657* (2013.01); *G06F 12/0802* (2013.01); *G11C 11/005* (2013.01); *G11C 11/221* (2013.01); *G11C 11/225* (2013.01); *G11C 8/12* (2013.01)

(58) Field of Classification Search
CPC ..... G11C 11/22; G11C 11/223; G11C 11/225; G11C 11/5657
See application file for complete search history.

(56) References Cited

U.S. PATENT DOCUMENTS

| | | | | |
|---|---|---|---|---|
| 5,198,994 A | * | 3/1993 | Natori | G11C 11/22 257/295 |
| 6,067,244 A | * | 5/2000 | Ma | G11C 11/22 365/145 |
| 2004/0062071 A1 | * | 4/2004 | Rodriguez | G11C 11/22 365/145 |
| 2005/0162890 A1 | * | 7/2005 | Yamada | G11C 11/22 365/145 |
| 2005/0193164 A1 | * | 9/2005 | Royer, Jr. | B82Y 10/00 711/113 |
| 2007/0103960 A1 | * | 5/2007 | Hamberg | G06F 12/0238 365/145 |
| 2010/0073988 A1 | * | 3/2010 | Takahashi | G11C 11/22 365/145 |
| 2012/0203951 A1 | * | 8/2012 | Wood | G11C 16/28 711/102 |
| 2015/0043274 A1 | * | 2/2015 | Liu | G11C 13/0064 365/163 |
| 2015/0162063 A1 | * | 6/2015 | Mueller | G11C 11/221 365/145 |

* cited by examiner

*Primary Examiner* — Edward J Dudek, Jr.
*Assistant Examiner* — Andrew Russell
(74) *Attorney, Agent, or Firm* — Danielson Legal LLC

(57) ABSTRACT

MLVM is a DRAM product that has the flexibility for certain performance characteristics to change based on programming characteristics made when writing the data and the ability to write multiple bits of data at the same time. At the simplest level, this means that depending on the type of operation(s) being executed, certain more favorable characteristics can be programmed into the DRAM to get benefits over the current state of the art. The most likely benefits would be in power utilization and heat.

22 Claims, 19 Drawing Sheets

MULTI-LEVEL VERSATILE MEMORY

CROSS REFERENCE TO RELATED APPLICATIONS

The present application claims the benefit U.S. provisional application No. 62/160,513, filed on May 12, 2015, the entire disclosure of which is incorporated by reference as if set forth in its entirety herein.

TECHNICAL FIELD

This disclosure relates to a method of programming and reading a multi-level Ferroelectric-gated Field Effect Transistor (FeFET) memory, herein referred to as Multi-Level Versatile Memory (MLVM). In particular, different methods of read and write operations are exercised in order to read and write multiple bits in a single operation.

BACKGROUND

Random Access Memory (RAM) is a type of short-term data storage that the computer processor can quickly access. It consists of an array of addressable storage cells that each stores a bit of information (either a zero or one).

RAM falls into two general categories, static and dynamic. The storage unit of a static RAM (SRAM) cell is typically a bi-stable flip-flop whose state indicates the stored value. The storage unit of a dynamic RAM (DRAM) cell is typically an integrated circuit capacitor whose charge indicates the stored value. Because the capacitor leaks charge, DRAM requires control circuitry to "refresh" the stored data by reading each cell's stored value and writing it back. This refresh operation occurs as often as every few milliseconds. DRAM can structurally achieve a higher memory density than SRAM; therefore, it is cheaper and has broader applications in volatile memory.

In addition, there is a non-volatile memory commonly referred to as Flash. Flash memory devices are generally classified into NAND flash memory devices and NOR flash memory devices. While NOR flash memory devices include memory cells that are independently connected to bit lines and word lines and have an excellent random access time, NAND flash memory devices include memory cells that are connected in series so that only one contact per cell string is necessary. Therefore, NAND flash memory devices have an excellent degree of integration. Accordingly, NAND structures are mainly used in high-integrated flash memory devices.

A well-known NAND flash memory device includes a memory cell array, a row decoder and a page buffer. The memory cell array includes word lines elongating along rows, bit lines elongating along columns, and cell strings corresponding to the respective bit lines.

FIG. 4 presents the prior art 1T1C DRAM cell, which is the current industry standard due to its simplicity and small size. Successive DRAM generations have gradually reduced the cell size by shrinking both the transistor and capacitor, thereby achieving higher memory densities and lower production costs. However, since the 1 Mb DRAM generation in the mid-1980's, the capacitor has been forced to assume increasingly complicated 3-dimensional structures to store enough charge for a given cell size. While variations on the standard DRAM design have replaced the capacitor with an alternate secondary storage unit such as a resistor, magnetic tunnel junction (MTJ), etc., the presence of a secondary component has limited DRAM's continued scalability.

While early MOS memory was originally a stand-alone component within the computer, recent memory development has focused on the integration of memory and logic on a single chip—a feat that allows for improved performance, lower power consumption, less board space requirements, and reduced number of chips, among other advantages. FIG. 2 illustrates the basic layout of embedded memory in a System-on-a-Chip (SoC). While SRAM is widely used as an embedded memory, it is subject to standby power dissipation and increased susceptibility to soft errors. Embedded DRAM can bypass these challenges and also allow for higher memory densities; however, the presence of the capacitor in existing DRAM designs has made it incompatible with standard CMOS processes.

SUMMARY

This summary is provided to introduce a selection of concepts in a simplified form that are further described below in the Detailed Description section. This summary is not intended to identify or exclude key features or essential features of the claimed subject matter, nor is it intended to be used as an aid in determining the scope of the claimed subject matter.

In one aspect, embodiments of the present invention relate to a method for programming a ferroelectric memory. The method includes receiving, using a controller, a multi-bit data value to be stored in a ferroelectric memory; determining, using the controller, at least one signal characteristic for a signal to be used to store the multi-bit data value in the ferroelectric memory; and applying, using the controller, a signal having the at least one determined signal characteristic to the ferroelectric memory to store a value representing the multi-bit data value.

In one embodiment, the method further includes selecting, using the controller, at least one desired performance characteristic for the multi-bit data value to be stored in the ferroelectric memory; and wherein the at least one signal characteristic further satisfies the at least one desired performance characteristic. The at least one desired performance characteristic may be at least one of a desired retention characteristic, a desired endurance characteristic, a desired speed characteristic, a desired energy characteristic, and a desired error-rate characteristic.

In one embodiment, the ferroelectric memory is a ferroelectric field effect transistor, a ferroelectric field effect transistor memory, or a ferroelectric random access memory.

In one embodiment, the at least one desired performance characteristic is selected from the group consisting of retention time, interval between refresh, read speed, set speed, read energy, set energy, refresh energy, read current, set current, refresh current, and read-out window.

In one embodiment, the at least one signal characteristic is selected from the group consisting of current direction, current magnitude, voltage magnitude, power, duration, and waveform structure.

In one embodiment, the at least one signal characteristic is selected to satisfy at least one of a constraint on power consumed, a constraint on electromagnetic field generation, a constraint on available voltage levels, a constraint on endurance, a constraint on error rate, and a constraint on retention time.

In one embodiment, the controller is a multiplexer or microprocessor.

In one embodiment, the at least one desired performance characteristic is selected based on an operation being executed by a microprocessor.

In one embodiment, the at least one desired performance characteristic is selected based on the timing of successive data storage operations.

In one embodiment, the ferroelectric memory for storage is selected from a plurality of ferroelectric memories based on the desired performance characteristic.

In another aspect, embodiments of the present invention relate to a system for programming a ferroelectric memory. The system includes a ferroelectric memory; and a controller configured to write a multi-bit data value to the ferroelectric memory, wherein the controller determines at least one signal characteristic for a signal to be used to store the multi-bit data value to the ferroelectric memory and applies a signal having the at least one determined signal characteristic to the ferroelectric memory to store a value representing the multi-bit data value.

In one embodiment, the controller further selects at least one desired performance characteristic for the multi-bit data value to be stored in the ferroelectric memory; and wherein the at least one signal characteristic further satisfies the at least one desired performance characteristic.

In one embodiment, the at least one desired performance characteristic is at least one of a desired retention characteristic, a desired endurance characteristic, a desired speed characteristic, a desired energy characteristic, and a desired error-rate characteristic.

In one embodiment, the ferroelectric memory is a ferroelectric field effect transistor, a ferroelectric field effect transistor memory, or a ferroelectric random access memory.

In one embodiment, the controller selects the desired performance characteristic from the group consisting of retention time, interval between refresh, read speed, set speed, read energy, set energy, refresh energy, read current, set current, refresh current, and read-out window.

In one embodiment, the controller selects the at least one signal characteristic from the group consisting of current direction, current magnitude, voltage magnitude, power, duration, and waveform structure.

In one embodiment, the controller selects the at least one signal characteristic to satisfy at least one of a constraint on power consumed, a constraint on electromagnetic field generation, a constraint on available voltage levels, a constraint on endurance, a constraint on error rate, and a constraint on retention time.

In one embodiment, the controller is selected from the group consisting of a multiplexer and a microprocessor.

In one embodiment, the system further includes a microprocessor, wherein the controller selects the desired performance characteristic based on an operation being executed by the microprocessor.

In one embodiment, the controller selects the desired performance characteristic based on the timing of successive data storage operations.

In one embodiment, the system further includes a plurality of ferroelectric memories and wherein the ferroelectric memory for storage is selected from the plurality of ferroelectric memories based on the desired performance characteristic.

These and other features and advantages, which characterize the present non-limiting embodiments, will be apparent from a reading of the following detailed description and a review of the associated drawings. It is to be understood that both the foregoing general description and the following detailed description are explanatory only and are not restrictive of the non-limiting embodiments as claimed.

BRIEF DESCRIPTION OF THE DRAWINGS

Non-limiting and non-exhaustive embodiments are described with reference to the following figures in which.

DETAILED DESCRIPTION

Figure 1:
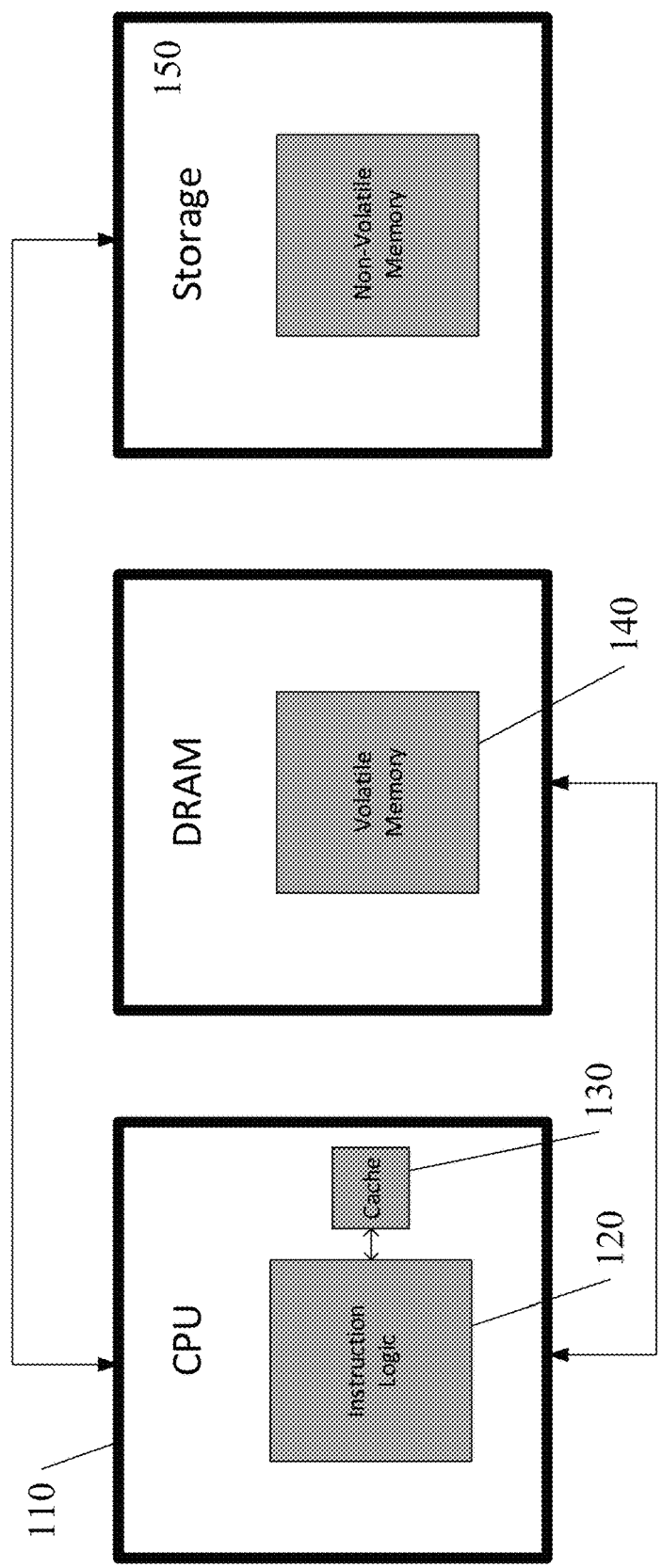
FIG. 1 is a block diagram depicting the processing, memory, and storage functions of a basic computer.

The following is the traditional hierarchy of memory within a computer system in which the first levels have the least amount of storage space, cost the most, and have the fastest performance while the later levels have the most storage space, cost the least, and have slower performance. Performance in this case can be defined as the read speed (time to read the memory) and the write speed (time to write to the memory). The first level of memory, known as the instruction cache, is composed of registers inside the actual processor. The second level is usually also a part of the processor and is referred to as the data cache 130. The data cache can be further segmented into levels (L1, L2, L3, etc) in the same relationship as described with memory (most modern CPUs have at least 2 levels of data cache). Subsequently, the memory used is a random access memory 140. These memories can be static or dynamic depending on the function of the system. Next, the memory is usually referred to as disk and refers to a nonvolatile memory product 150 that can store data longer (and without power). Finally, there is a class of memory called tertiary storage, which refers to DVDs, CDs, tape, and disks.

In the traditional architecture, all levels before the disk level are traditionally thought of as volatile memories, meaning power is required to retain the data. All subsequent levels are referred to as nonvolatile.

Additionally in the current state of the art, the performance characteristics of each type of memory remain constant and are well-defined. Performance characteristics for memory include but are not limited to read speed, write speed, read energy, write energy, data retention, endurance, and size.

This memory system is also primarily considered to exist across the entire CPU, but in the current state of the art, the same system applies to most graphics cards, which include their own dedicated dynamic random access memory (DRAM).

DRAM is a volatile memory, which means if the data is not refreshed within a certain time interval, the stored value can no longer be guaranteed to be accurate. The interval for the current state of the art DRAM is 64 ms.

MLVM is a DRAM product that has the flexibility for certain performance characteristics to change based on programming characteristics made when writing the data and the ability to write multiple bits of data at the same time. At the simplest level, this means that depending on the type of operation(s) being executed, certain more favorable characteristics can be programmed into the DRAM to get benefits over the current state of the art. The most likely benefits would be in power utilization and heat.

Moreover due to the nature of computing, data is stored as bits, where each DRAM stores a single bit. However, in practice most computing applications store data on the order of bytes (or 8 bits). Therefore, if one were able to store multiple bits in a single DRAM unit, then this would allow for much greater flexibility with regards to storage density.

For example when rendering a video, if the resolution is 1000×800, at least 800,000 bytes of DRAM are programmed with the values of the pixels on the screen and must be refreshed at least every 64 ms. However in most video operation, less than 5% of the screen actually changes every 64 ms. Therefore, by writing the DRAM in a certain way, it would be possible to have a longer retention on the DRAM and access it less, which improves both power utilization and heat generation.

In terms of types of operations, the current state of the art of computing has well-defined characteristics for how often DRAM is used during normal operation. Knowing the types of instructions being executed and programming the DRAM effectively can achieve tremendous savings and ultimately lead to lower cost.

Figure 4A:
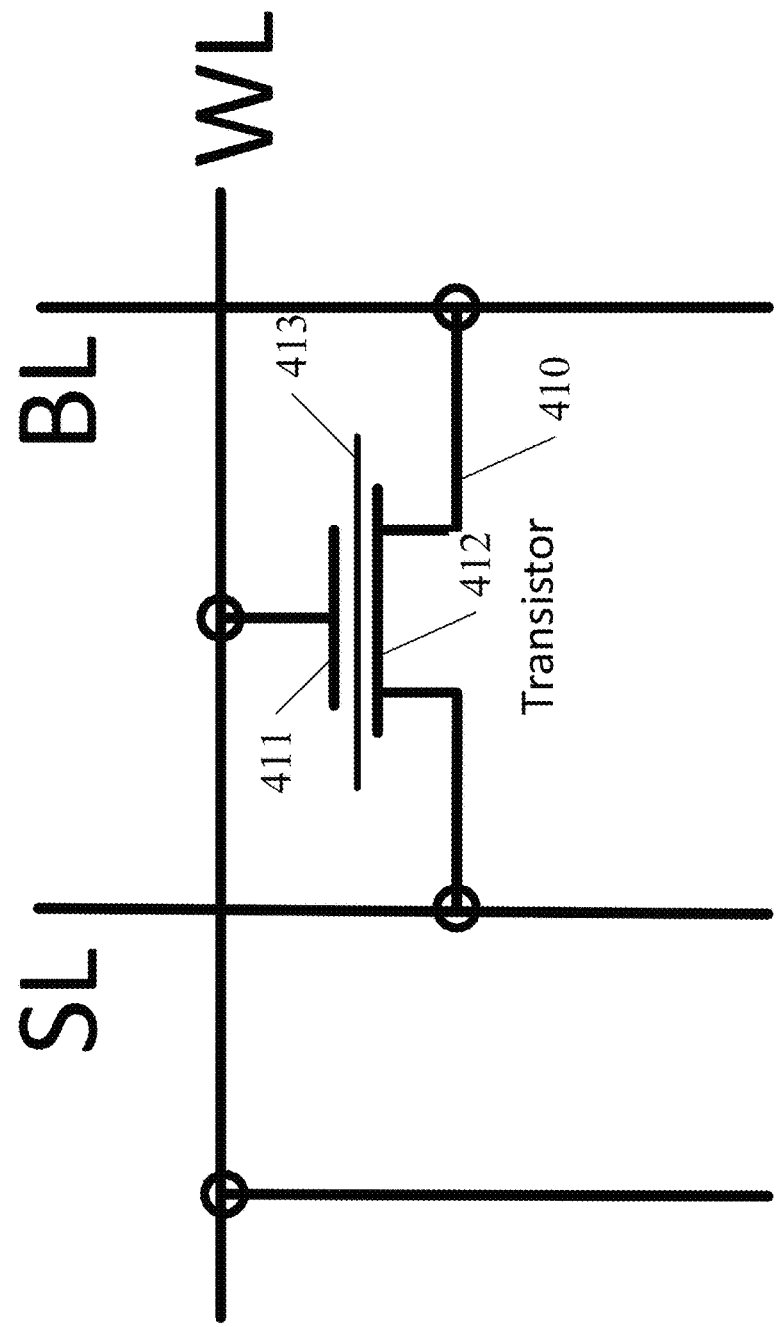
FIG. 4A is a circuit diagram depicting the single-transistor architecture of a typical MLVM cell.

Multi-Level Versatile Memory (MLVM) may be used to perform the functions of DRAM (U.S. Pat. No. 6,067,244) as well as non-volatile memory (U.S. Pat. No. 5,198,994). It can also be programmed to multiple levels per cell, gaining the distinction of being multi-level. FIG. 4A presents the architecture of a typical MLVM cell, with the ferroelectric field effect transistor (FET) as its fundamental storage unit. Because the MLVM cell lacks a capacitor or other secondary storage component, it is suitable for embedded applications and its size depends on only the transistor. MLVM also possesses a (1) long retention time that enables low refresh frequency and (2) a non-destructive read operation. The recent discovery of HfO2-based ferroelectrics (J Müller et al, Appl. Phys. Lett., 99, 112901 (2011)) has overcome the limitations of the state-of-the-art ferroelectric materials such as lead zirconate titanate (PZT) and strontium bismuth tantalate (SBT), making MLVM more suitable for commercial application.

FIG. 1 is a simplified block diagram of the processing and data storage functions of a typical computer, with DRAM as a standalone volatile memory 140. Three broad tiers of the memory hierarchy that the CPU 120 accesses through bi-directional data communication are described as follows: (1) the cache 130 within the CPU provides fast memory access; (2) DRAM 140 provides volatile data storage; and (3) external memory 150, typically accessed through I/O circuitry or other control logic, provides non-volatile data storage.

Instruction logic 120 refers to the components of the Von Neumann architecture of the processer and arithmetic logic unit and also includes the instruction cache. The instruction cache is the fastest level of temporary storage that can be used by the processor to store calculations. Instruction cache memory is volatile in nature.

Cache 130 refers to the data cache component which can be broken down into several levels of cache, each level progressively larger in size, but slower in data access performance. Most modern architectures include at least two levels of cache in the data cache. The data cache is volatile in nature, and one embodiment of the invention would be to be implemented in the data cache.

Some current implementations of data storage 150 may include a volatile memory cache for faster access. It should be noted that this cache could also be included as a possible embodiment of the invention, although the preferred embodiment lies in volatile memory 140.

Figure 2:
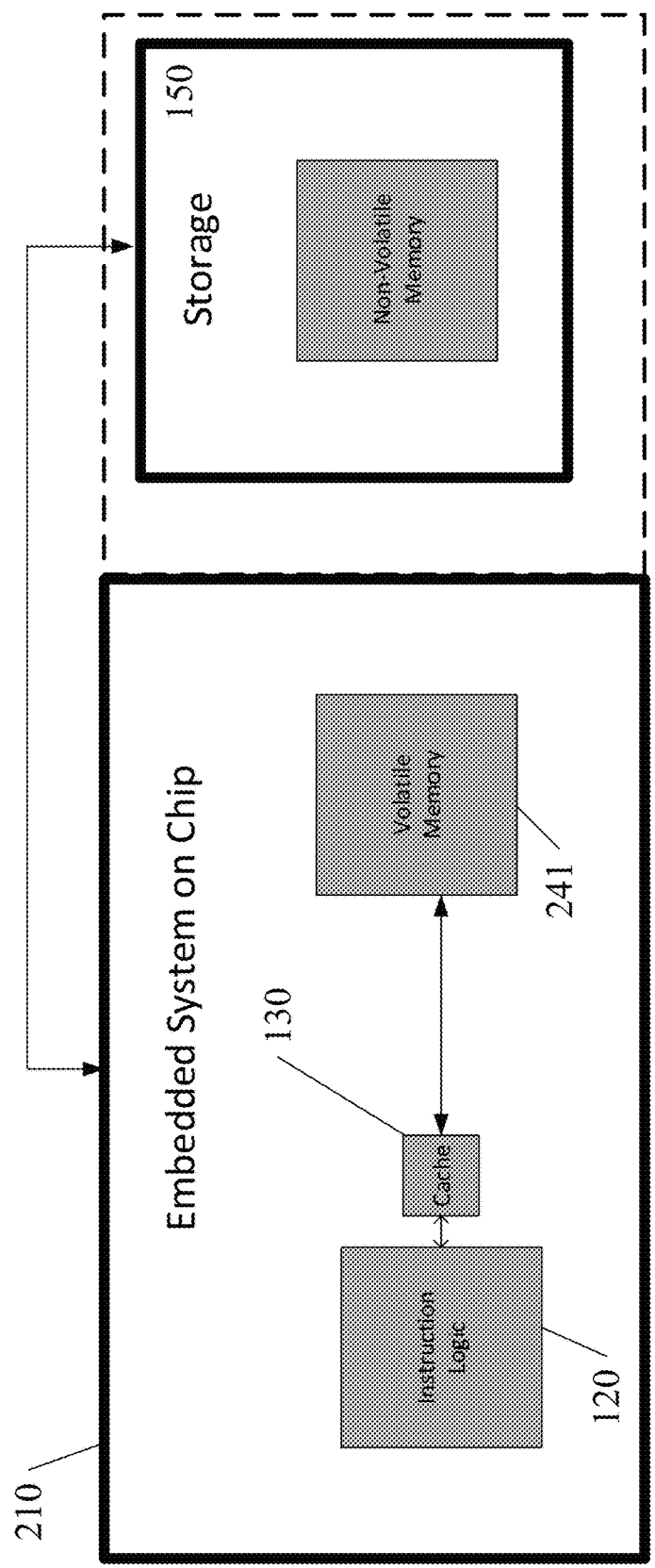
FIG. 2 is a block diagram depicting an embedded SoC, with integrated on-chip memory supporting the core logic.

FIG. 2 is a simplified block diagram of a SoC with on-chip DRAM. The embedded DRAM 141 provides memory support to the core logic function of the CPU 120.

Note that as previously mentioned cache 130 can also be implemented as MLVM.

Figure 3:
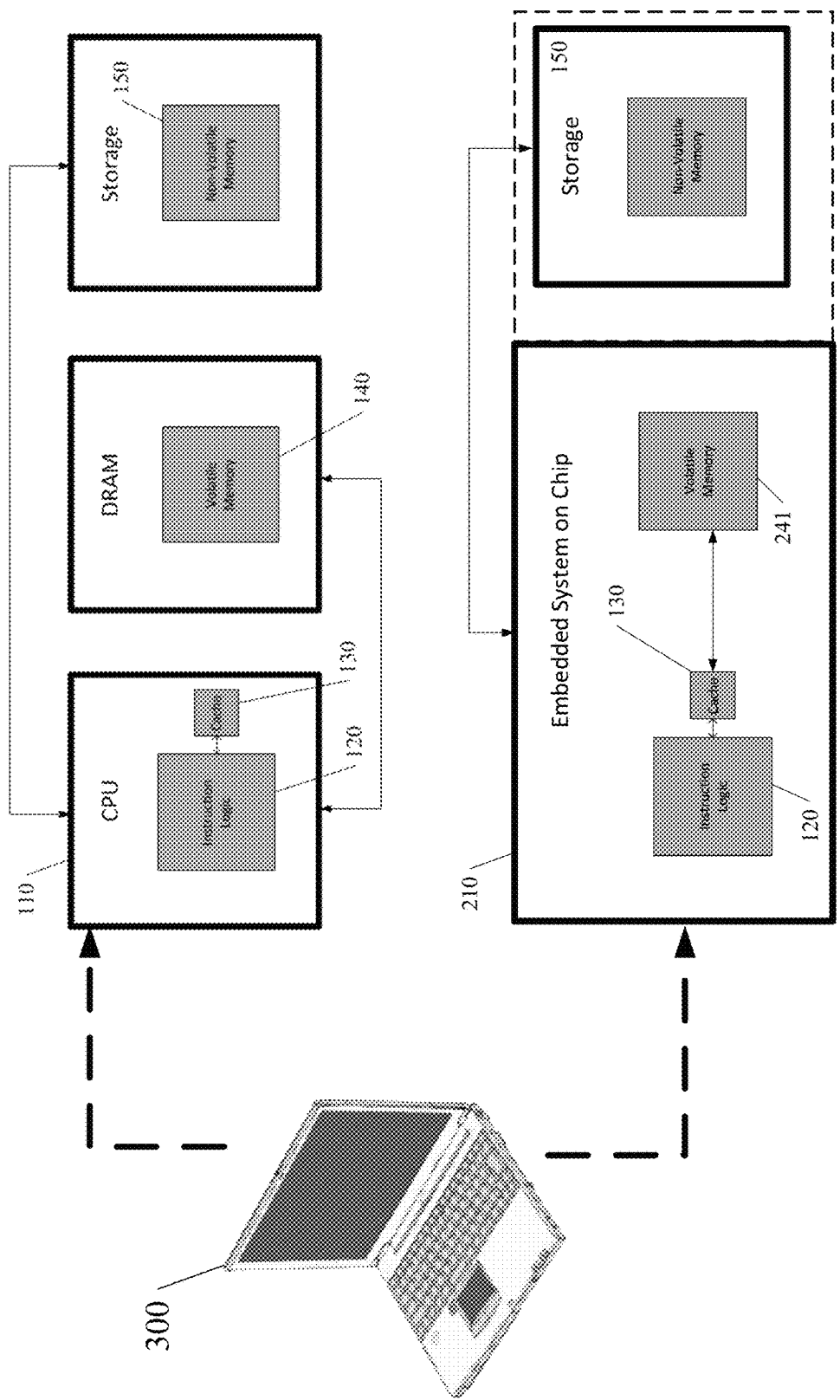
FIG. 3 is an illustration of a device that can be either a method of FIG. 1 or FIG. 2.

As shown in FIG. 3, a computing device such as a laptop 310 can be a method of either FIG. 1 or FIG. 2.

FIG. 4A illustrates the single-transistor architecture of an MLVM cell. The fundamental storage unit of the cell is a ferroelectric field-effect transistor (FeFET) 410. The makeup of the FeFET is metal layer 411, silicon layer 412, and the ferroelectric layer 413. The ferroelectric layer is what differs from traditional transistors. In the preferred embodiment, the ferroelectric layer is made of hafnium oxide, as illustrated in U.S. Pat. No. 6,067,244 to Ma, the entire disclosure of which is hereby incorporated by reference in its entirety.

Figure 4B:
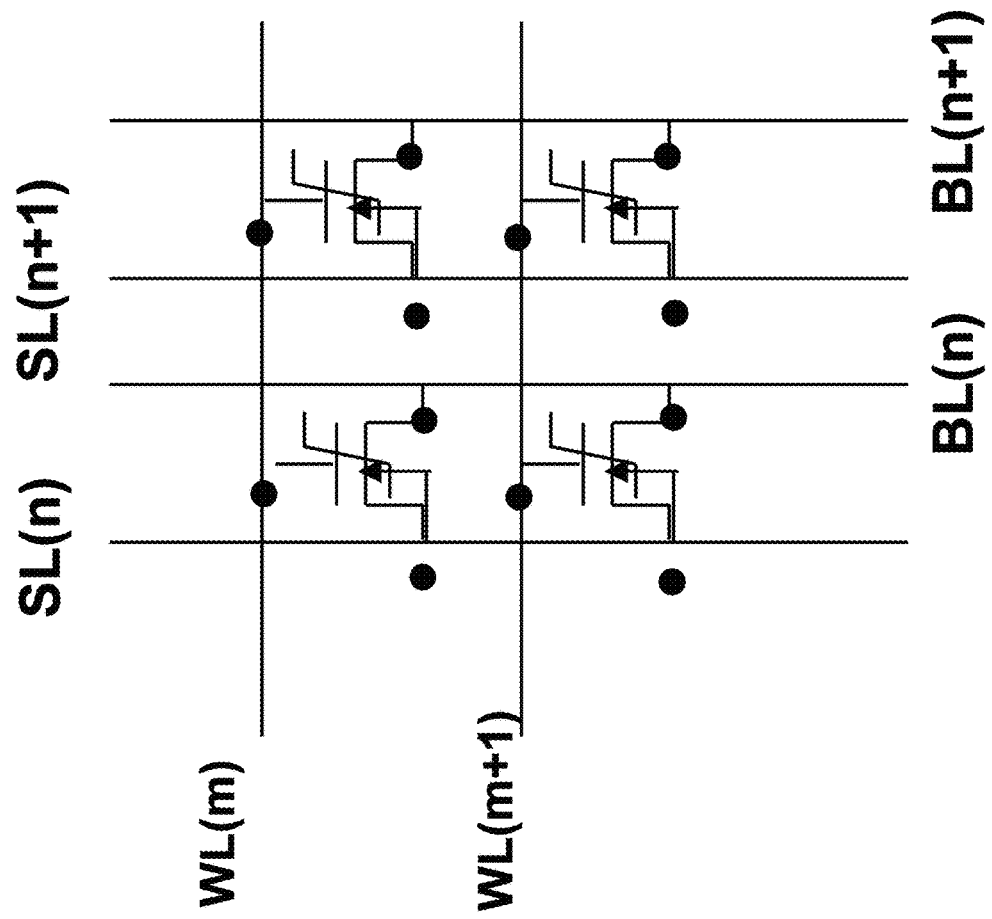
FIG. 4B is a circuit diagram depicting the entire array of a MLVM array.

FIG. 4B depicts an entire array format for an MLVM array. This embodiment is arranged in a NOR format.

Figure 5A:
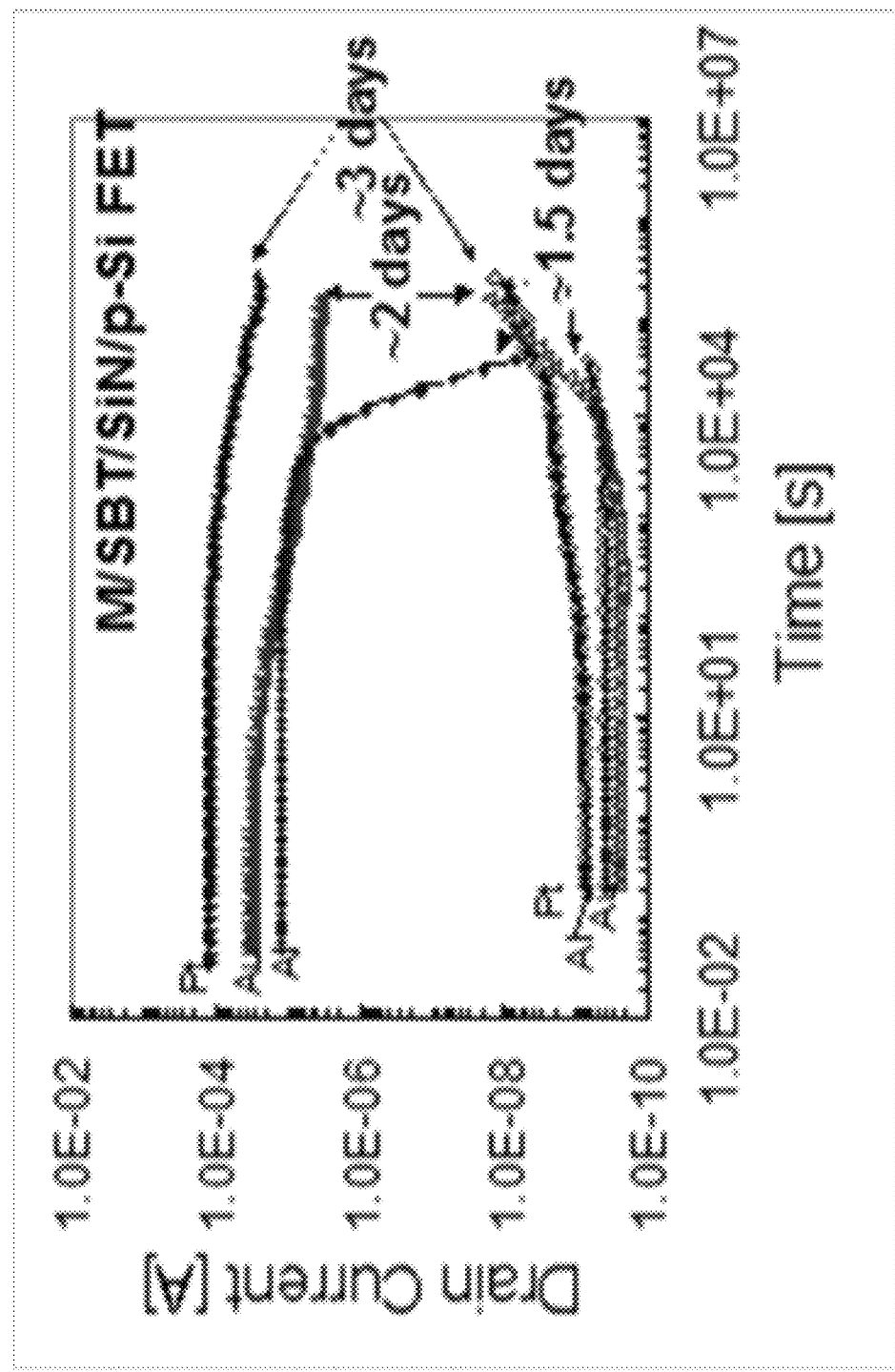
FIG. 5A illustrates the relationship between data retention time and programming current for an MLVM cell.

FIG. 5A depicts a characteristic relationship between the data retention time of the MLVM cell and the current used for programming. One who is skilled in the art will appreciate that using different current magnitudes to write to the cell, a longer data retention characteristic is achieved.

Figure 5B:
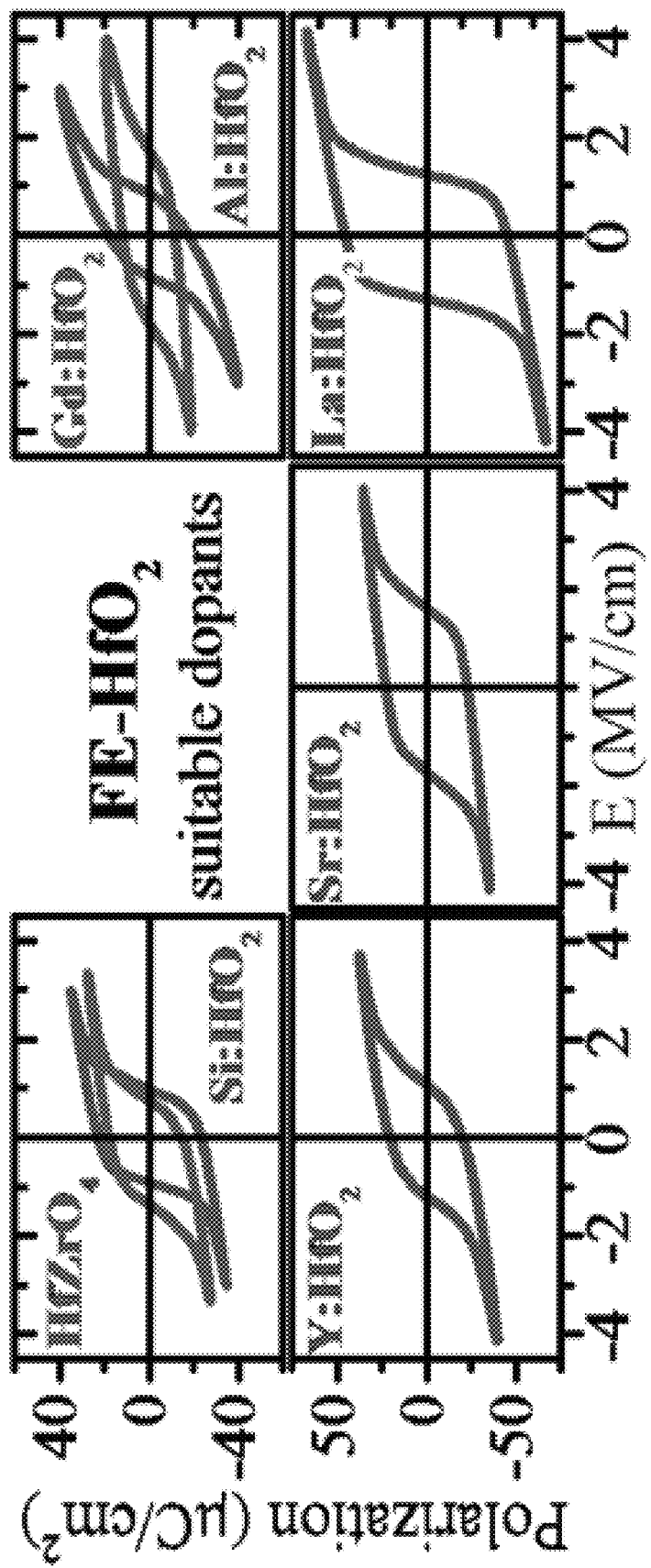
FIG. 5B illustrates the hysteresis properties of an MLVM cell.

FIG. 5B depicts the hysteresis of an MLVM cell (using different materials for construction) for the necessary voltage needed to write to an MLVM cell. This means that at least that amount of voltage within the memory window of the hysteresis is required in order to successfully write to a cell.

Figure 5C:
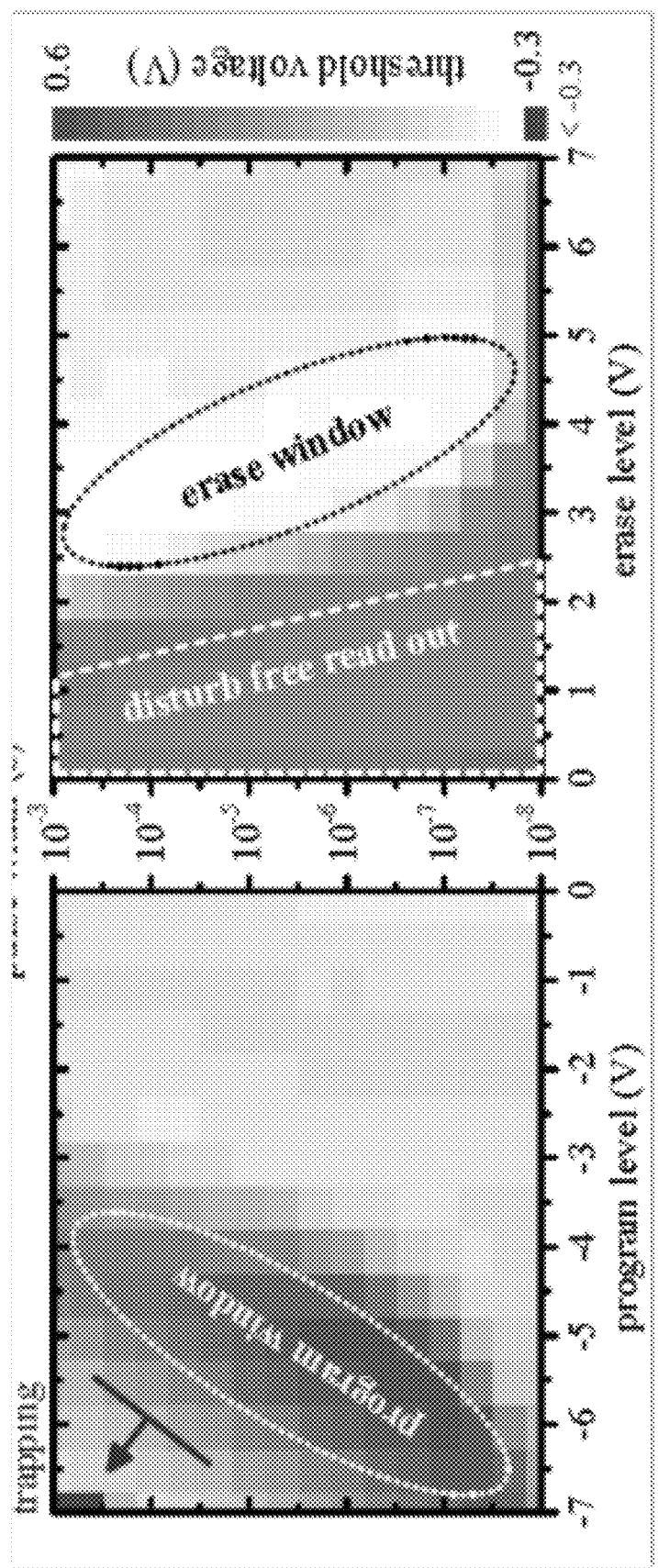
FIG. 5C illustrates the program and erase window voltages for an MLVM cell.

FIG. 5C depicts the program and erase window of a ferroelectric hafnium oxide MLVM cell. These windows are necessary to define the bounds in which the voltage applied is necessary to either write or erase an MLVM cell.

Figure 5D:
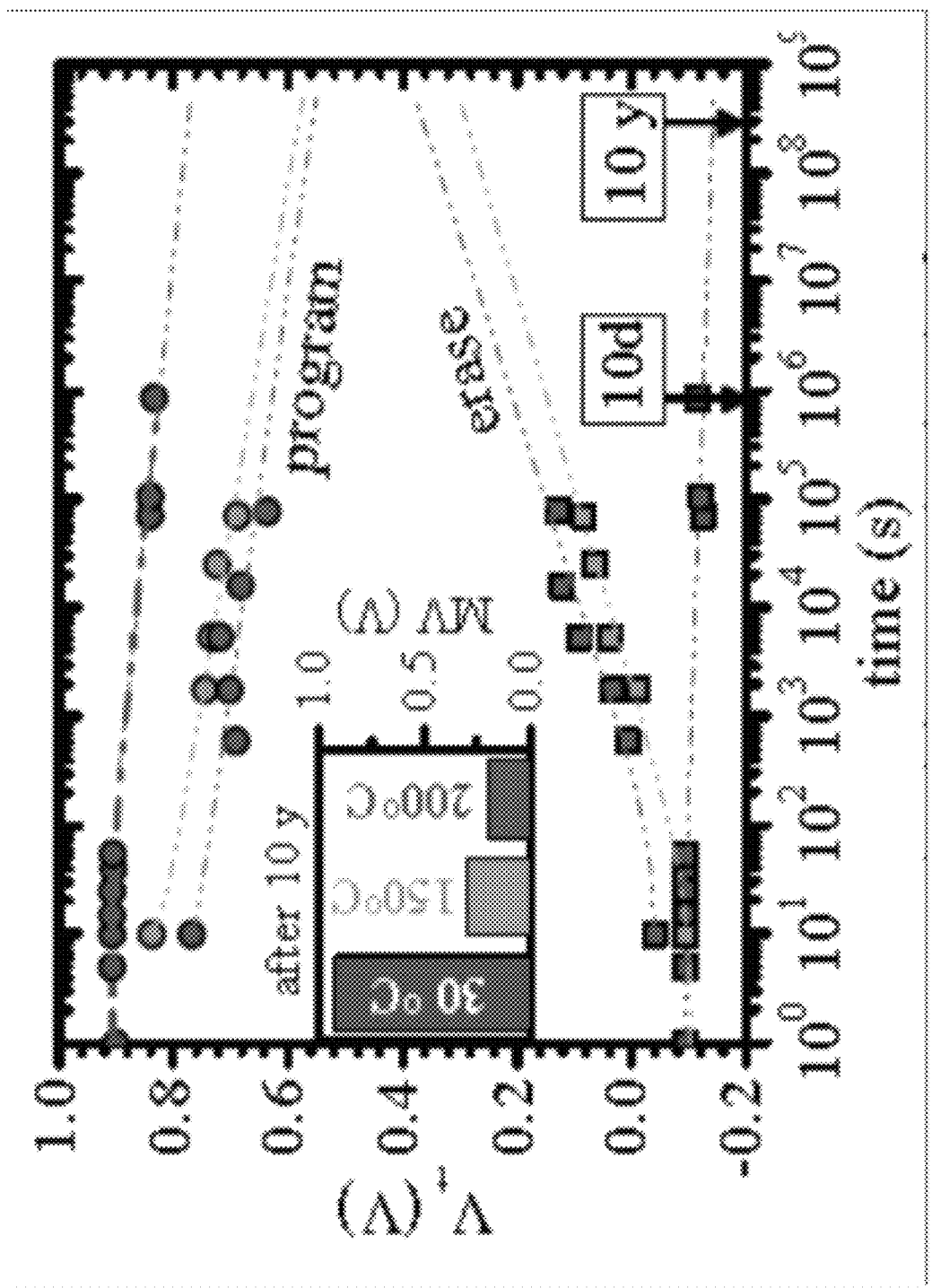
FIG. 5D illustrates the tradeoff between time and voltage for an MLVM cell.

FIG. 5D depicts the data retention of a ferroelectric hafnium oxide MLVM cell. The data retention defines how long the data is retained in the cell, or defines the interval between a refresh for how long the data stored in the cell is considered reliable.

Figure 5E:
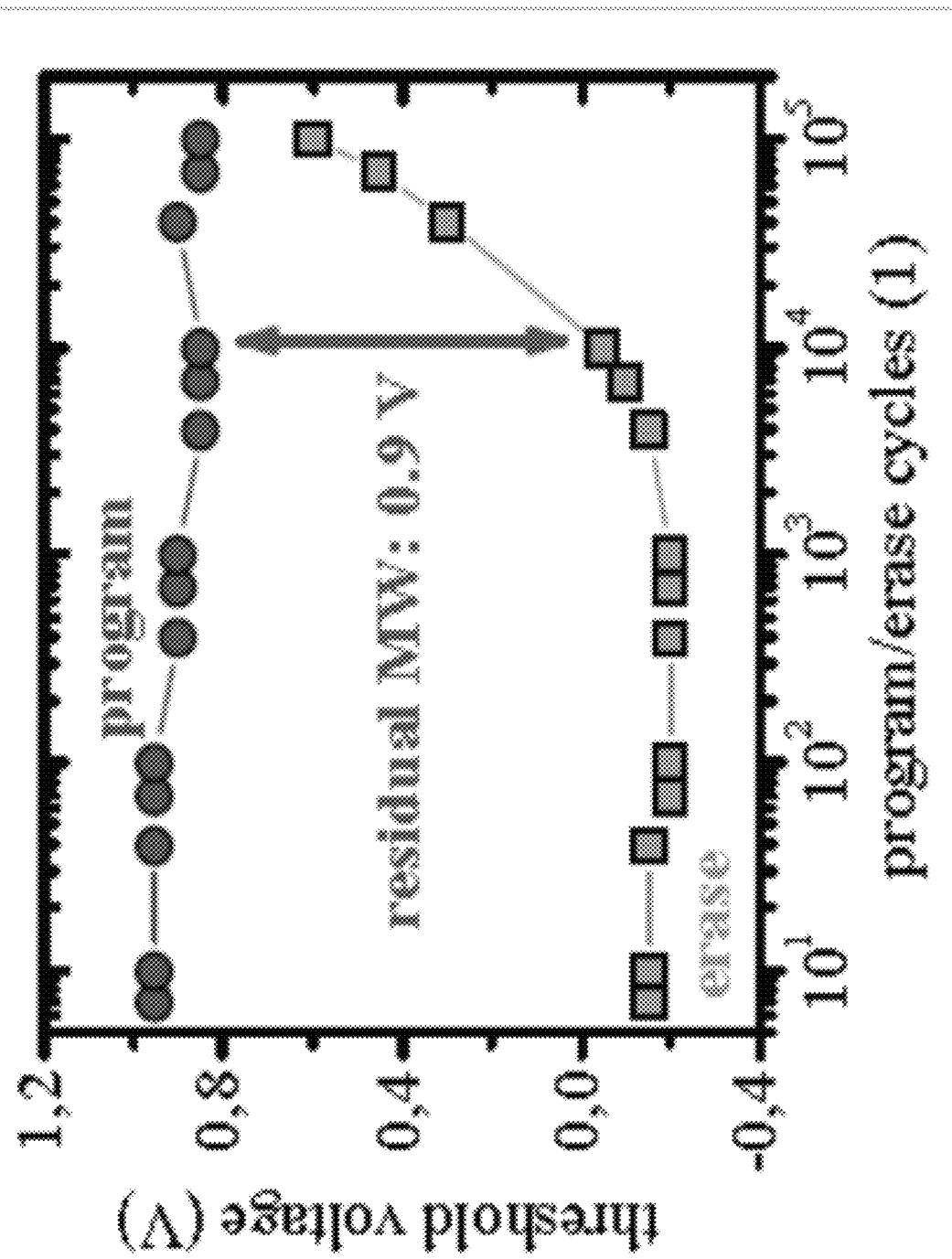
FIGS. 5E & 5F illustrate the tradeoff between voltage and endurance for an MLVM cell.

FIG. 5E shows the endurance of a ferroelectric hafnium oxide MLVM cell. The endurance speaks to the number of times a cell can be written to be considered reliable.

Figure 5F:
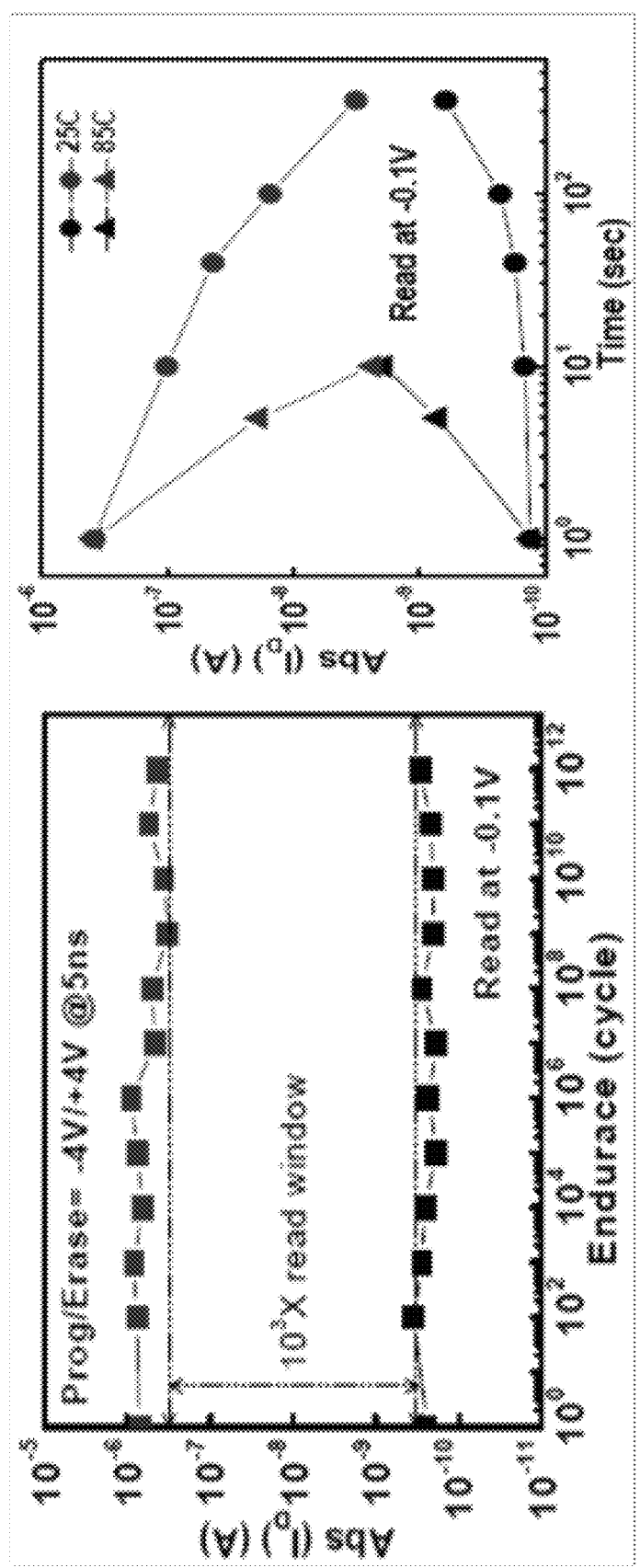

FIG. 5F shows a contrasting approach to FIGS. 5D and 5E in that a hafnium oxide MLVM cell has extremely high endurance but low retention.

One who is skilled in the art will appreciate that there is an inherent power relationship between current and voltage defined as Power equals Current times Voltage or P=IV. Taken together, FIGS. 5A and 5B define a range of acceptable programming parameters that will achieve different degrees of data retention (depending on how much data retention one wishes to achieve). As the current state of the art DRAM has a data retention of 64 ms, one who is skilled in the art can appreciate that there is a vast range in acceptable programming ranges to achieve varying degrees of retention. The key benefit to a longer data retention is that since there will be a longer interval between refreshes, the DRAM will use significantly less energy to operate.

Another benefit to a longer retention is that the DRAM itself will produce less heat. Because there is less frequency of use, the semiconductor itself generates less heat, which would lead to a reduction in cooling costs. In an industry that requires a lot of computer cooling (such as data centers/server farms), more electricity is actually spend on infrastructure costs (cooling) than on powering the machinery. A thermally cooler DRAM would result in tremendous savings to these industries.

However, one who is skilled in the art will note that the optimal operating parameters are not designed to program the DRAM for the longest retention every time. This would result in a higher-than-necessary current being applied if the subsequent operations were likely to overwrite the DRAM. Thus it is necessary to determine how much voltage is actually required.

Another dimension of MLVM programming is duration of the voltage being applied. By applying voltages at different durations as highlighted in FIG. 5C, a different relationship between endurance and data retention is achieved in the MLVM cell.

One who is skilled in the art will appreciate that given the bounds defined from FIGS. 5A to 5F, there is a very large range of possible combinations with respect to voltage and duration in order to achieve different combinations of retention and endurance. In fact, the space of combinations is virtually infinite. Because of this flexibility, there can be tremendous savings in terms of implementation as either the voltage applied or the duration of the charge may be advantageous in certain situations.

For example, while the traditional short duration higher voltage programming may be in traditional applications, a lower voltage longer duration programming would be ideal in system on chip applications since there would be less interference from the electromagnetic fields.

Figure 6A:
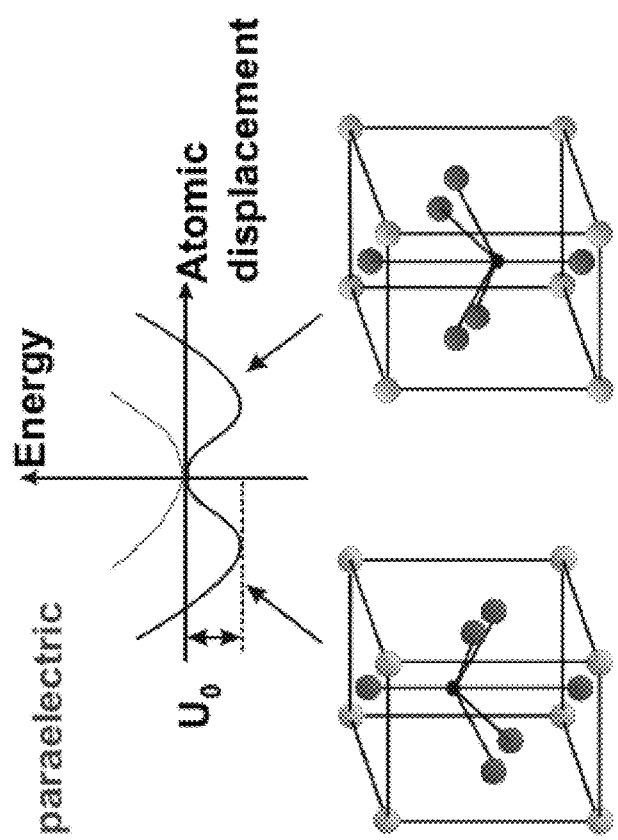
FIG. 6A illustrates the double well of an MLVM cell.

FIG. 6A depicts the double-well phenomena with ferroelectric field effect transistors (FeFET). The axis of the graph indicates the relationship between energy (U) and polarization (P). The presence of the double-well enables the different states within the FeFET to develop to enable MLVM. The double well forms in FeFETs based on there being two equal energy minima for equal and opposite polarizations.

Figure 6B:
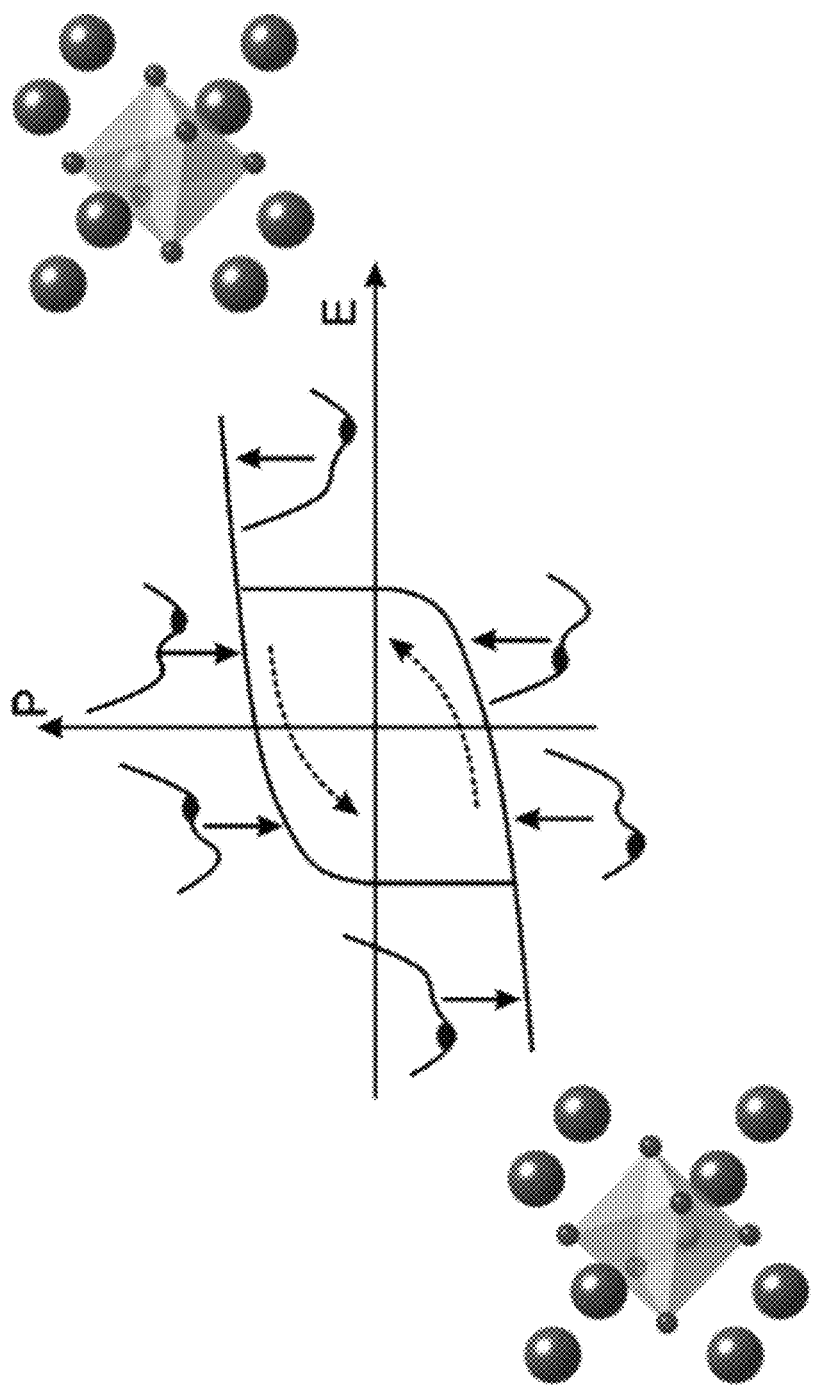
FIG. 6B illustrates one embodiment of four states in an MLVM programming.

FIG. 6B depicts the programming methods of the double well along with the necessary hysteresis curve to show the different states. The black dot indicates the direction of the electric field used in programming.

Figure 6C:
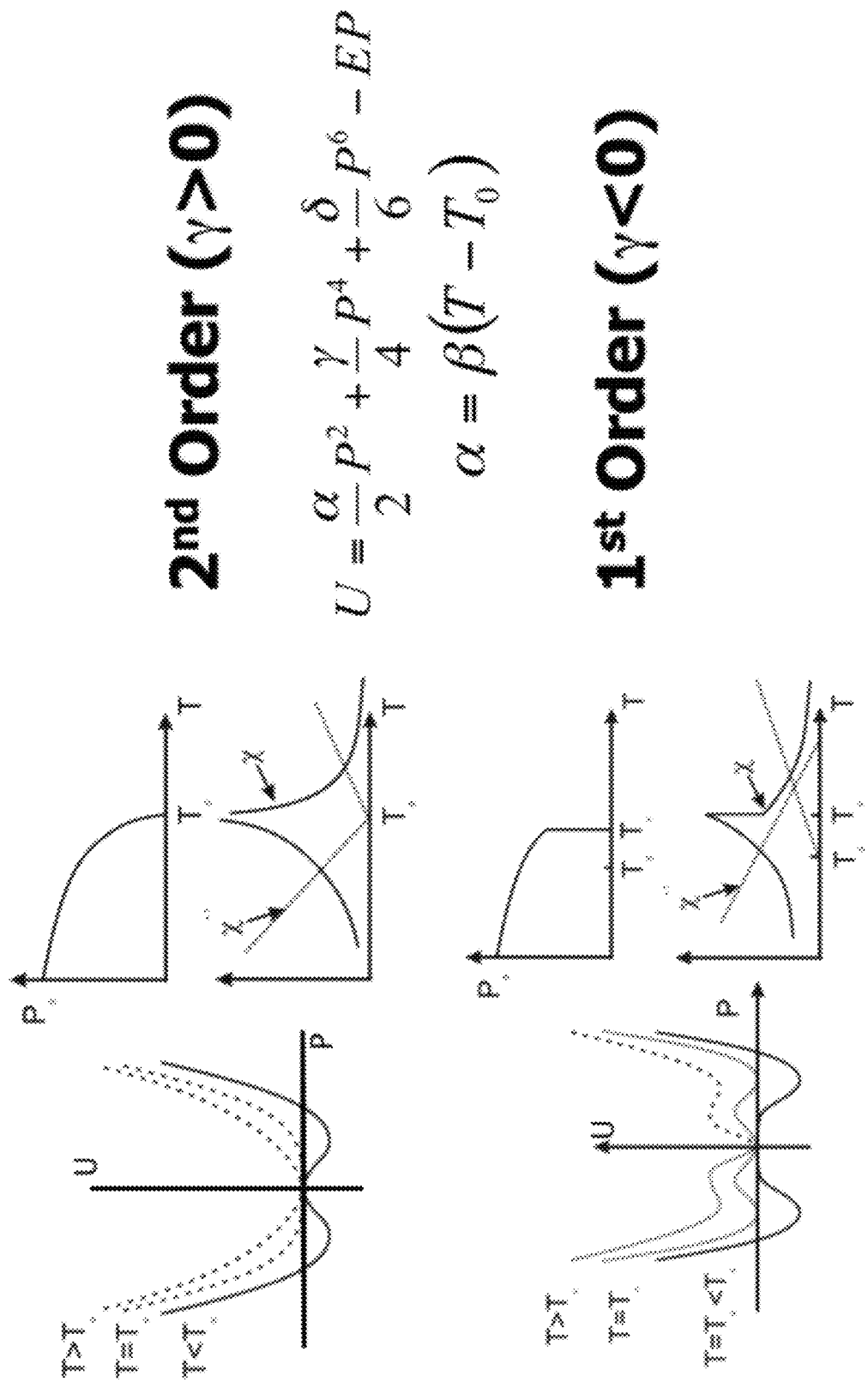
FIG. 6C illustrates the higher symmetry phases in an MLVM cell enabling further states.

FIG. 6C depicts the possibility of multiple higher symmetry phases within the double well through the use of temperature.

Figure 6D:
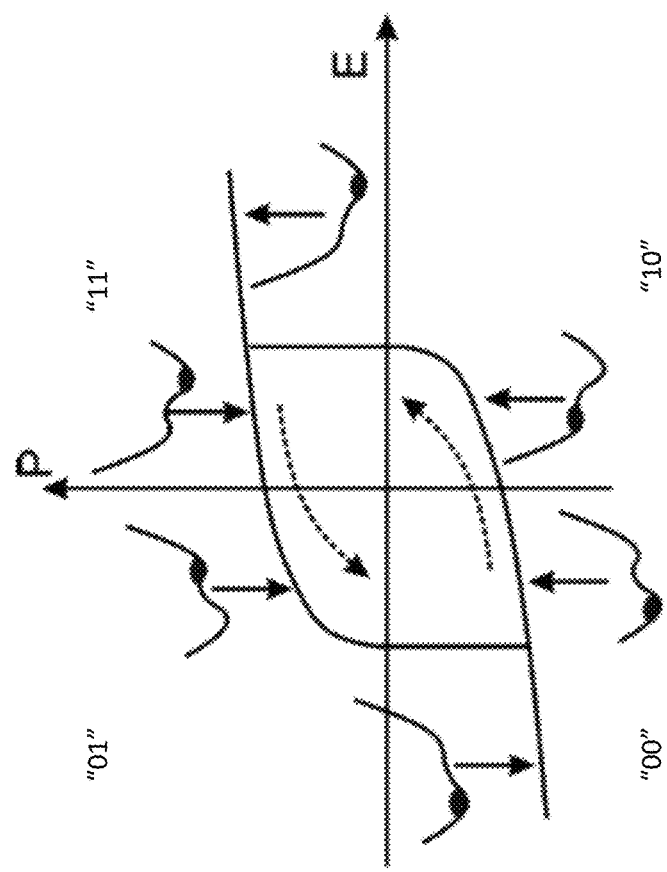
FIG. 6D illustrates the proposed mapping of bits for an MLVM cell.

FIG. 6D depicts a possible mapping of multiple-level bits within the nominal programming hysteresis window.

Figure 6E:
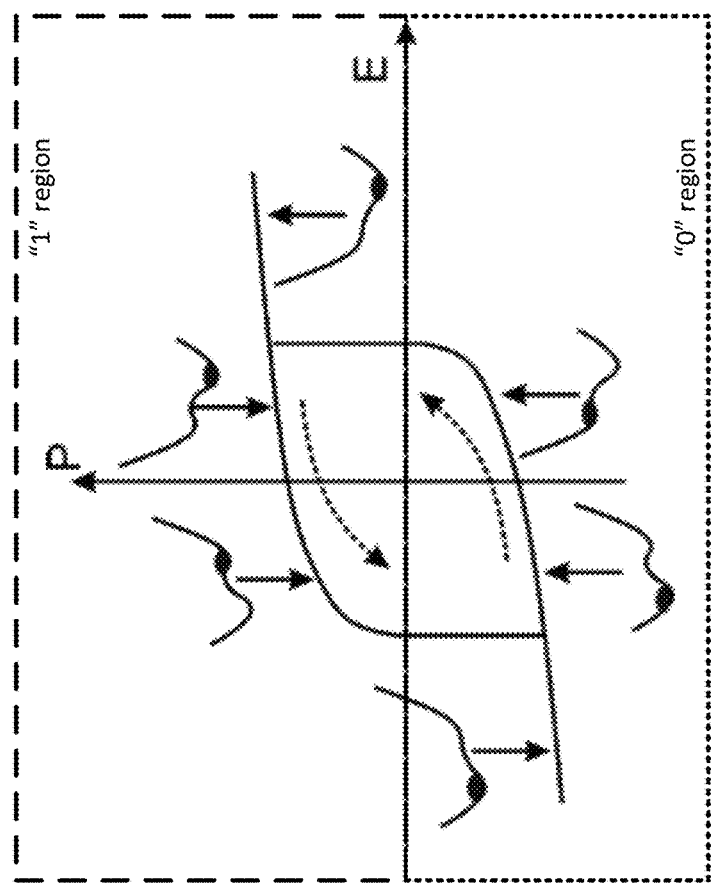
FIG. 6E illustrates the transition between a multi-level state to a single-level state in Versatile Memory.

FIG. 6E depicts a mapping of FIG. 6D wherein a transition occurs from single-level to multi-level programming for a MLVM.

In MLVM, the double well represents the potential for the FeFETs to be programmed in multiple states. This means that when one executes the programming as described in FIGS. 5A and 5B, there will be potential to program the cell to the multiple bit states as described in FIG. 6D. One who is skilled in the art will understand that in order to create such states in the MLVM, this can be accomplished through different measures of current direction and intensity, leading to the switch in the states.

For example, when looking at FIG. 6D, one can ascribe a traditional two-bit mapping for the states as is shown. In order to switch from one state to another, one simply needs to tune the programming parameters in terms of direction, current and voltage to obtain the necessary energy to switch to the new desired state.

By mapping FIG. 6D to the FIGS. 5D and 5F, one can achieve the versatility of MLVM as well as the multi-level programming as was previously described. This, again, is done through tuning the programming parameters. Due to the stability of the well, the increase in voltage will cause the retention of the cell to last longer.

FIG. 6C serves to show that a FeFET could be adapted to have multiple states that enable more bits to be programmed. In general the number of states required is illustrated by the relationship $2b$ where b represents the number of bits. Through the use of temperature regulation, the FeFET could be adapted to have additional symmetry states.

Figure 7:
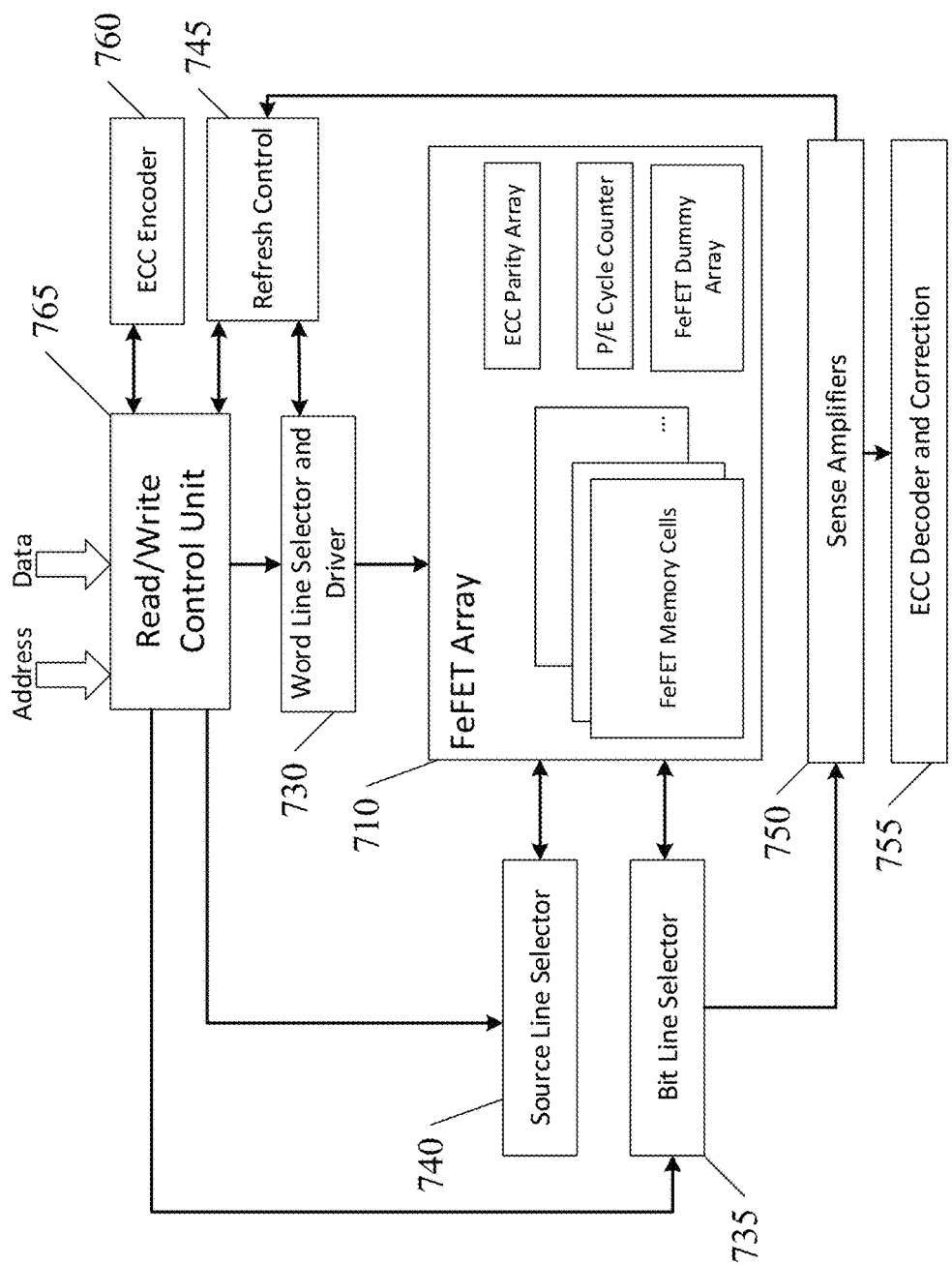
FIG. 7 is a block diagram of an exemplary embodiment of an MLVM circuit.

FIG. 7 depicts a logical diagram for one embodiment of an MLVM circuit, which can be either non-volatile or volatile. The entire circuit 700 which can include any combination of FeFET arrays 710, word line selector and driver 730, bit line selector 735, source line selector 740, refresh circuitry 745, sense amplifiers 750, error checking and correcting units 755, and read/write control circuitry 765. In the embodiment illustrated, there is one of each of these units. However, other embodiments exist that can contain zero or multiple of any of these elements, as illustrated in U.S. Pat. No. 6,067,244 to Ma, the disclosure of which is hereby incorporated by reference in its entirety.

Furthermore one who is skilled in the art would note that a full MLVM product may contain one or more of circuit 700 and that each circuit 700 may be different with slight variations. For example one circuit 700a may contain error checking and correcting units 755 while another circuit 700b does not. However, circuit 700a may be connected to circuit 700b so that the unit within circuit 700a communicates with circuit 700b.

In order to implement the different levels of data retention as previously defined, read/write control circuitry 765 would need to be enhanced beyond the standard read/write circuitry. In addition to the standard circuitry, an additional optional input can be added that overrides the "normal" operating parameters.

Figure 8:
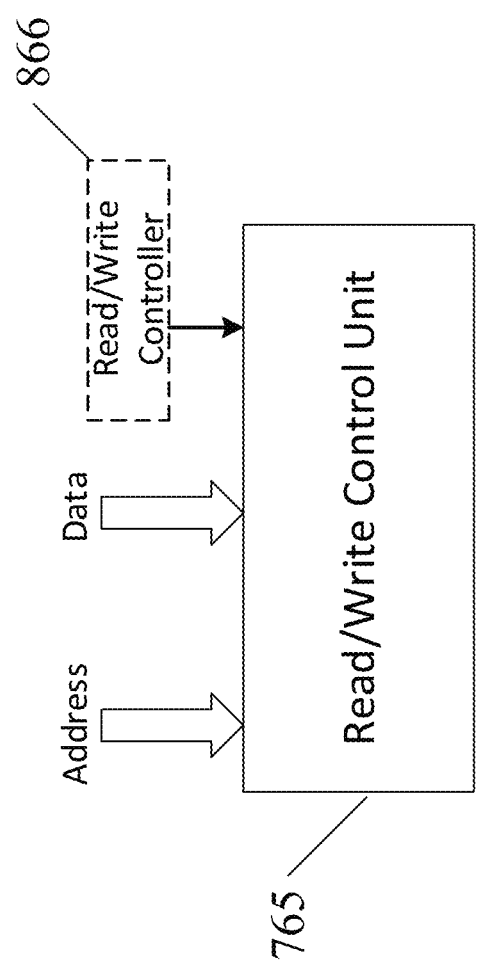
FIG. 8 is a block diagram depicting standard and accessory inputs to the MLVM read/write control circuitry.

This additional input can be specified in many ways and is depicted in FIG. 8 by read/write controller 866. Note that read/write controller 866 is an optional component of MLVM and that other circuitry normally accepted as part of read/write control circuitry 865 is not otherwise depicted in the logical block diagram. One embodiment of read/write controller 866 is a multiplexer that selects a different direction, current, and voltage depending on the type of operational instruction that is currently being executed. This operation type would need to be communicated to the read/write controller 866 through an external source as part of the instruction set.

One who is skilled in the art will note that although a MLVM cell can be produced, it may not always be advantageous to operate in MLVM mode. Therefore the read/write controller 765 is modified from the current art to know whether the corresponding cells it is programming are in a single-level or multi-level mode.

Furthermore, when the change from a single-level to multi-level is required it will be noted that there are different procedures required. In this case, no data is lost since the available storage space at least doubles. In our preferred embodiment, the rightmost bit is the low order bit and there would be an additional bit available to writing in each cell as the leftmost bit. One who is skilled in the art will note that such transitions are generally done via software controlling the memory, so any special handling of the data should be handled by the software in this scenario.

Additionally, when changing from multi-level to single-level, different procedures are required as well. In this scenario, half the data is lost. In our preferred embodiment, we drop the leftmost bit and only read from the rightmost. One who is skilled in the art will note that while the data is defined as being "lost" it is not actually lost. What occurs is simply that the left bit is ignored, so that if a transition occurred back to multi-level, then the data could be retained. Additionally, one who is skilled in the art will note that these hardware issues are more generally handled via software, so special handling of the memory should occur at a higher layer.

Another embodiment of read/write controller 866 would be to measure the interval between successive writes to memory cells of read/write control circuitry 865. If the average interval between successive writes is high, it means the memory is being changed constantly and a lower current and voltage combination could be utilized. If the average interval between writes is long, then a higher voltage and current combination would be utilized.

One who is skilled in the art would also note that the embodiments described for read/write controller 866 need not be implemented physically on an MLVM. The same read/write controller function 866 could come from an external source such as the processor 120 in System on Chip (SoC) implementations as depicted in FIG. 2.

Figure 9:
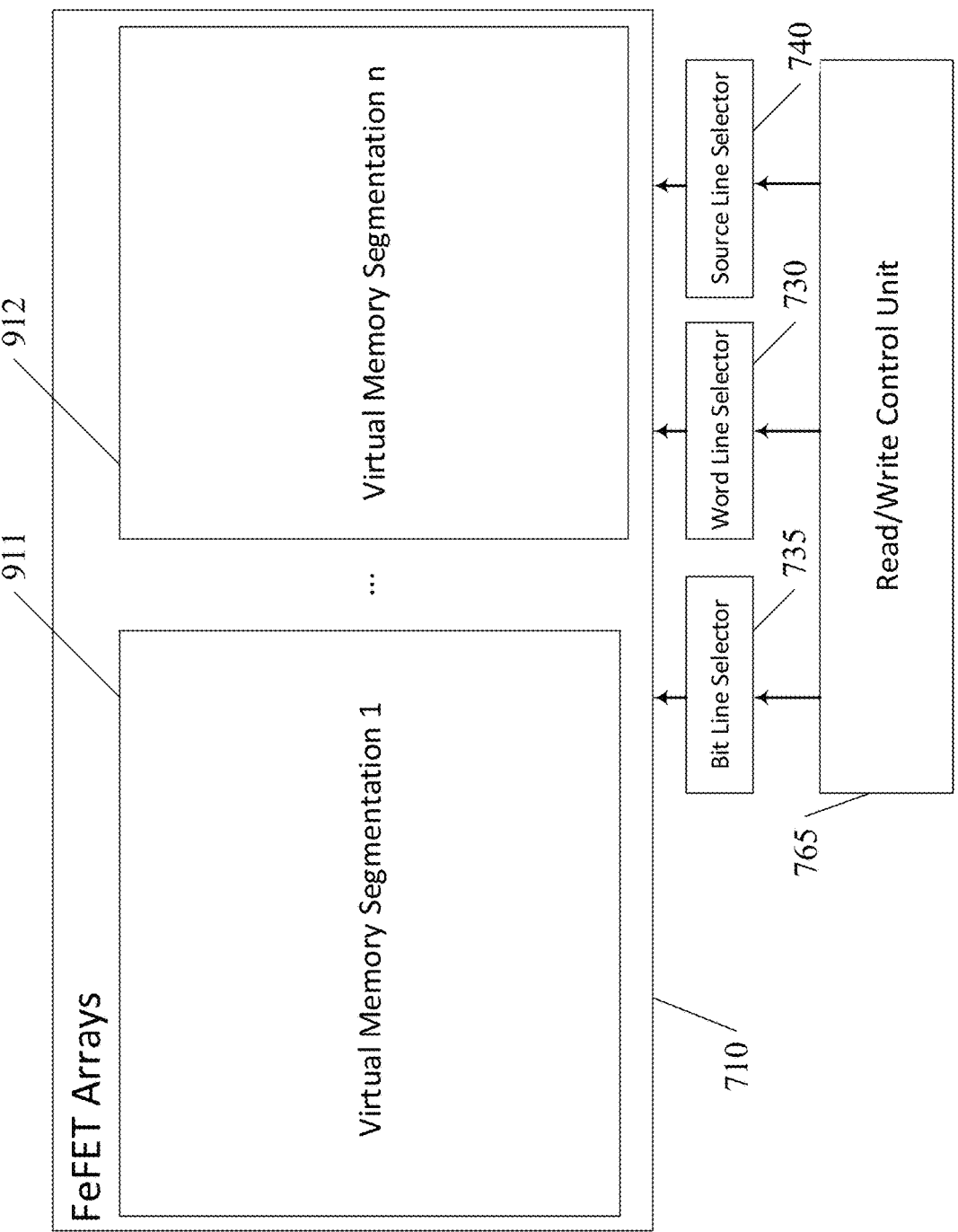
FIG. 9 is a block diagram depicting the segmentation scheme of an MLVM array.

FIG. 9 depicts a virtual segmentation of the of the memory cells. The entire MLVM memory array 900 has a first segmentation 911 and a second segmentation 912. Each segmentation 911 and 912 corresponds to a range of MLVM cells that are being written with a certain characteristic for data retention. For the following examples the segmentation 911 refers to a lower power, shorter data retention function while the segmentation 912 refers to a higher power, longer duration data retention function.

For the purposes of MLVM, the virtual segmentation must be aware of how many bits are being represented in each FeFET. It can only create segmentations of bits that are of size evenly divisible by the number of bits represented in each FeFET.

While it is possible to program each MLVM cell specifically, the management of such operations may result in more overhead than is feasible. By creating a segmentation within the MLVM itself, the DRAM layer of the memory tree more closely resembles the data cache layer (L1 cache, L2 cache, L3 cache, . . . ).

In an analog to how cache operations are executed on that data cache of a processor, the different segments within MLVM could have different normalized operations set, that would closely approximate the optimal configuration of write voltage and current.

For example in a computer that has multiple operations occurring at the same time, a web browser session with a streaming video may be loaded. In this instance, the data for the browser session and the video itself would be loaded into the segmentation 912 because they correspond to an operation that is less likely to change. However, if the video began playback, the corresponding display of the video would get saved into the segmentation 911 because while the video is playing, the data is more likely to change rapidly.

One who is skilled in the art will appreciate that while only two segmentations 911 and 912 are shown, there can be any number of segmentations one or more within the MLVM. Furthermore, one can appreciate that the number of segmentations would dynamically change during operation. During the dynamic process, different segmentations could be added that either have a shorter retention or longer retention depending on the characteristics of the data set that need to be stored within the DRAM.

The implementation of how the segmentation behavior is likely to behave will be different depending on the product that uses the MLVM. For example, a graphics card product that has to drive displays is likely to have different segmentations built into the product. In fact, there may physically be different instances of MLVM that correspond to different types of operation. Within the graphics card, certain parts of the screen will always be allocated to the lower power segmentation because they are less likely to change within the next frame that needs to be changed. However, the computations of the graphics cards to represent objects such as 3-dimensional physics would likely need to constantly change as they are calculated constantly.

In the actual segmentation of 911 and 912, it is important to note that within the virtual segmentation, not all cells need to be mapped to the same segmentation repeatedly. In fact, the mapping is likely to be switched in most embodiments because all memory products have a characteristic known as endurance. The endurance is the number of times the memory cell can be written to before it is no longer expected to function reliably. By varying the virtual mapping of cells to physical cells, it is much less likely that any one cell would be at the end of its endurance before the other. One embodiment of the algorithm in which this mapping is determined is to simply randomly assign the cells each time a segmentation occurs. (At a minimum, a segmentation would occur each time the computer changed from a powered off state to a powered on state.)

As referred to in FIG. 2, one embodiment of the invention could be a scenario in which data cache 130 and volatile memory 141 are combined to be a single physical MLVM. In this scenario, some number of virtual segmentations 911 and 912 could be implemented to accomplish the same functionality as both the data cache and volatile memory in an embedded application.

What is claimed is:

1. A method for programming a ferroelectric memory to store data sourced from a computational operation executed by a processor, the method comprising:
receiving, using a controller, a multi-bit data value from the processor, to be stored in a ferroelectric transistor memory having a transistor gate comprising a ferroelectric material that controls flow of current through the ferroelectric transistor memory;
determining, using the controller, at least one signal characteristic for a signal to be used to store the multi-bit data value in the ferroelectric transistor memory, wherein the at least one signal characteristic is determined based on a type of the computational operation executed by the processor and is not determined based on a result of the computational operation; and executing a write operation, the write operation comprising applying, using the controller, the signal having the at least one determined signal characteristic to the ferroelectric transistor memory to store a value representing the multi-bit data value.

2. The method of claim 1, further comprising selecting, using the controller, at least one desired performance characteristic for the multi-bit data value to be stored in the ferroelectric transistor memory; and wherein the at least one signal characteristic further satisfies the at least one desired performance characteristic.

3. The method of claim 2 wherein the at least one desired performance characteristic is at least one of a desired retention characteristic, a desired endurance characteristic, a desired speed characteristic, a desired energy characteristic, a desired memory size characteristic, and a desired error-rate characteristic.

4. The method of claim 1 wherein the ferroelectric transistor memory is a ferroelectric field effect transistor, a ferroelectric field effect transistor memory, or a ferroelectric random access memory.

5. The method of claim 2 wherein the at least one desired performance characteristic is selected from the group consisting of retention time, interval between refresh, read speed, set speed, read energy, set energy, refresh energy, read current, set current, refresh current, memory size, storage density, and read-out window.

6. The method of claim 1 wherein the at least one signal characteristic is selected from the group consisting of current direction, current magnitude, voltage magnitude, power, duration, and waveform structure.

7. The method of claim 2 wherein the at least one signal characteristic is selected to satisfy at least one of a constraint on power consumed, a constraint on electromagnetic field generation, a constraint on available voltage levels, a constraint on endurance, a constraint on error rate, a constraint on memory size, and a constraint on retention time.

8. The method of claim 1 wherein:
the ferroelectric transistor memory comprises a first virtual memory segment having a first performance characteristic and a second virtual memory segment having a second performance characteristic different than the first performance characteristic; and
the controller selects the first virtual memory segment to store the value representing the multi-bit data value based on the first performance characteristic.

9. The method of claim 8 wherein the first performance characteristic is at least one of a retention characteristic or an energy characteristic.

10. The method of claim 2 wherein the at least one desired performance characteristic is selected based on an instruction provided by the processor executing the computational operation.

11. The method of claim 2 wherein the at least one desired performance characteristic is selected based on at least one of the timing of successive data storage operations and a number of prior data storage operations.

12. The method of claim 2 wherein the ferroelectric transistor memory for storage is selected from a plurality of ferroelectric transistor memories based on the desired performance characteristic.

13. A system for programming a ferroelectric memory to store data sourced from a computational operation executed by a processor, the system comprising:
a ferroelectric transistor memory having a transistor gate comprising a ferroelectric material that controls flow of current through the ferroelectric transistor memory; and
a controller configured to:
receive a multi-bit data value from the processor and to write the multi-bit data value to the ferroelectric transistor memory, wherein the controller determines at least one signal characteristic for a signal to be used to write the multi-bit data value to the ferroelectric transistor memory, wherein the at least one signal characteristic is selected based on a type of the computational operation executed by the processor and is not determined based on a result of the computational operation; and
execute a write operation, the write operation comprising applying the signal having the at least one determined signal characteristic to the ferroelectric transistor memory to store a value representing the multi-bit data value.

14. The system of claim 13 wherein the controller further selects at least one desired performance characteristic for the multi-bit data value to be stored in the ferroelectric transistor memory; and wherein the at least one signal characteristic further satisfies the at least one desired performance characteristic.

15. The system of claim 14 wherein the at least one desired performance characteristic is at least one of a desired retention characteristic, a desired endurance characteristic, a desired speed characteristic, a desired energy characteristic, a desired memory size characteristic and a desired error-rate characteristic.

16. The system of claim 13 wherein the ferroelectric transistor memory is a ferroelectric field effect transistor, a ferroelectric field effect transistor memory, or a ferroelectric random access memory.

17. The system of claim 14 wherein the controller selects the desired performance characteristic from the group consisting of retention time, interval between refresh, read speed, set speed, read energy, set energy, refresh energy, read current, set current, refresh current, memory size, storage density, and read-out window.

18. The system of claim 13 wherein the controller selects the at least one signal characteristic from the group consisting of current direction, current magnitude, voltage magnitude, power, duration, and waveform structure.

19. The system of claim 13 wherein the controller selects the at least one signal characteristic to satisfy at least one of a constraint on power consumed, a constraint on electromagnetic field generation, a constraint on available voltage levels, a constraint on endurance, a constraint on error rate, a constraint on memory size, and a constraint on retention time.

20. The system of claim 14, wherein the controller selects the at least one desired performance characteristic based on an instruction provided by the processor.

21. The system of claim 14 wherein the controller selects the desired performance characteristic based on at least one of the timing of successive data storage operations and a number of prior data storage operations.

22. The system of claim 14 further comprising a plurality of ferroelectric transistor memories and wherein the ferroelectric transistor memory for storage is selected from the plurality of ferroelectric memories based on the desired performance characteristic.

* * * * *